United States Patent
Jonsson et al.

(10) Patent No.: US 11,397,096 B2
(45) Date of Patent: Jul. 26, 2022

(54) DETERMINING AN EXTENT OF OPENING OF AN OPENABLE BARRIER BASED ON A MAGNETIC SENSOR

(71) Applicant: ASSA ABLOY AB, Stockholm (SE)

(72) Inventors: Tomas Jonsson, Rönninge (SE); Mats Cederblad, Hässelby (SE); Per Mackegård, Solna (SE); Stefan Johansson, Stockholm (SE)

(73) Assignee: ASSA ABLOY AB, Stockholm (SE)

( * ) Notice: Subject to any disclaimer, the term of this patent is extended or adjusted under 35 U.S.C. 154(b) by 0 days.

(21) Appl. No.: 17/285,854

(22) PCT Filed: Oct. 25, 2019

(86) PCT No.: PCT/EP2019/079285
§ 371 (c)(1),
(2) Date: Apr. 15, 2021

(87) PCT Pub. No.: WO2020/089124
PCT Pub. Date: May 7, 2020

(65) Prior Publication Data
US 2021/0372817 A1    Dec. 2, 2021

(30) Foreign Application Priority Data
Oct. 31, 2018    (SE) .................................. 1851362-2

(51) Int. Cl.
*G01D 5/14*    (2006.01)
(52) U.S. Cl.
CPC ..................... *G01D 5/14* (2013.01)

(58) Field of Classification Search
CPC ....................................................... G01D 5/14
See application file for complete search history.

(56) References Cited

U.S. PATENT DOCUMENTS

2012/0299314 A1*  11/2012  Jiang ..................... E05B 45/083
                                                            292/137
2014/0292001 A1   10/2014  Nunez et al.
(Continued)

FOREIGN PATENT DOCUMENTS

| EP | 2711905 | 3/2014 |
| EP | 3107077 | 12/2016 |

(Continued)

OTHER PUBLICATIONS

Official Action for Sweden Patent Application No. 1851362-2, dated May 3, 2019, 7 pages.
(Continued)

*Primary Examiner* — Walter L Lindsay, Jr.
*Assistant Examiner* — Milton Gonzalez
(74) *Attorney, Agent, or Firm* — Sheridan Ross P.C.

(57) ABSTRACT

It is provided a barrier assembly for determining an extent of opening of an openable barrier. The barrier assembly comprises the openable barrier and barrier frame around the openable barrier; a magnet, a magnetic sensor and a status monitoring device. One of the magnet and the magnetic sensor is provided in the barrier and the other of the magnet and the magnetic sensor is provided in the barrier frame; and the status monitoring device is configured to determine an extent of opening of the openable barrier based on a direction of a magnetic field detected by the magnetic sensor.

10 Claims, 2 Drawing Sheets

(56) References Cited

U.S. PATENT DOCUMENTS

| | | | |
|---|---|---|---|
| 2015/0348385 A1 | 12/2015 | Lamb et al. | |
| 2016/0054148 A1* | 2/2016 | Misfatto | G01D 5/14 73/514.02 |
| 2016/0187118 A1 | 6/2016 | Modi et al. | |
| 2016/0231349 A1* | 8/2016 | Scheiermann | G01D 5/14 |
| 2016/0290005 A1 | 10/2016 | Goldenson | |
| 2017/0341194 A1* | 11/2017 | Liu | H01F 7/06 |
| 2018/0233005 A1 | 8/2018 | Day | |
| 2018/0357867 A1* | 12/2018 | Jonsson | G08B 13/08 |
| 2019/0234110 A1* | 8/2019 | Laporta | E05B 7/00 |
| 2019/0234117 A1* | 8/2019 | Bextermoller | E05B 81/76 |

FOREIGN PATENT DOCUMENTS

| | | |
|---|---|---|
| JP | 2007-198053 | 8/2007 |
| WO | WO 2017/117397 | 7/2017 |

OTHER PUBLICATIONS

International Search Report and Written Opinion for International (PCT) Patent Application No. PCT/EP2019/079285, dated Feb. 14, 2020, 11 pages.
International Preliminary Report on Patentability for International (PCT) Patent Application No. PCT/EP2019/079285, dated Sep. 15, 2020, 14 pages.

* cited by examiner

DETERMINING AN EXTENT OF OPENING OF AN OPENABLE BARRIER BASED ON A MAGNETIC SENSOR

CROSS REFERENCE TO RELATED APPLICATIONS

This application is a national stage application under 35 U.S.C. 371 and claims the benefit of PCT Application No. PCT/EP2019/079285 having an international filing date of Oct. 25, 2019, which designated the United States, which PCT application claimed the benefit of Sweden Patent Application No. 1851362-2 filed Oct. 31, 2018, the disclosure of each of which are incorporated herein by reference.

TECHNICAL FIELD

The invention relates to a barrier assembly, a method, a computer program and a computer program product for determining an extent of opening of an openable barrier based on a magnetic sensor.

BACKGROUND

It is often useful to determine the open/closed state of openable barriers such as doors and windows. Such information can e.g. be used for alarm systems, climate control, etc.

It would be of particular use if the extent to which the openable barrier is open. This not only allows the determination of open or closed state but can also be used for determining ventilation, or other climate control.

SUMMARY

It is an object to provide an improved way in which the state of an openable barrier can be determined.

According to a first aspect, it is provided a barrier assembly for determining an extent of opening of an openable barrier. The barrier assembly comprises the openable barrier and barrier frame around the openable barrier; a magnet, a magnetic sensor and a status monitoring device. One of the magnet and the magnetic sensor is provided in the barrier and the other of the magnet and the magnetic sensor is provided in the barrier frame; and the status monitoring device is configured to determine an extent of opening of the openable barrier based on a direction of a magnetic field detected by the magnetic sensor.

The extent of opening of the barrier may be determined by comparing a direction of a magnetic field determined by the magnetic sensor, with a known orientation of the magnet.

The comparing of direction of magnetic field with the known orientation of the magnet may result in one of a plurality values defining an extent of opening of the openable barrier, wherein the plurality of values comprise respective representations of completely open, completely closed and a plurality of different extents of opening between completely open and completely closed.

The status monitoring device may form part of the magnetic sensor.

The barrier assembly may be a window assembly.

The barrier assembly may be a door assembly.

The barrier assembly may further comprise a lock state sensor being configured to detect when the openable barrier is in a locked state.

According to a second aspect, it is provided a method for determining an extent of opening of an openable barrier of a barrier assembly comprising the openable barrier and a barrier frame. The method is performed in a status monitor device and comprising the step of: determining an extent of opening of the openable barrier based on a direction of a magnetic field determined by a magnetic sensor, wherein one of a magnet and the magnetic sensor is provided in the barrier and the other of the magnet and the magnetic sensor is provided in the barrier frame.

The extent of opening of the barrier may be determined by comparing a direction of a magnetic field, detected by the magnetic sensor, with a known orientation of the magnet.

The comparing of direction of magnetic field with the known orientation of the magnet may result in one of a plurality values defining an extent of opening of the openable barrier, wherein the plurality of values comprise respective representations of completely open, completely closed and a plurality of different extents of opening between completely open and completely closed.

According to a third aspect, it is provided a computer program for determining an extent of opening of an openable barrier of a barrier assembly comprising the openable barrier and a barrier frame. The computer program comprises computer program code which, when run on a status monitor device causes the status monitor device to: determine an extent of opening of the openable barrier using a magnetic sensor, wherein one of a magnet and the magnetic sensor is provided in the barrier and the other of the magnet and the magnetic sensor is provided in the barrier frame.

According to a fourth aspect, it is provided a computer program product comprising a computer program according to the third aspect and a computer readable means on which the computer program is stored.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1A:
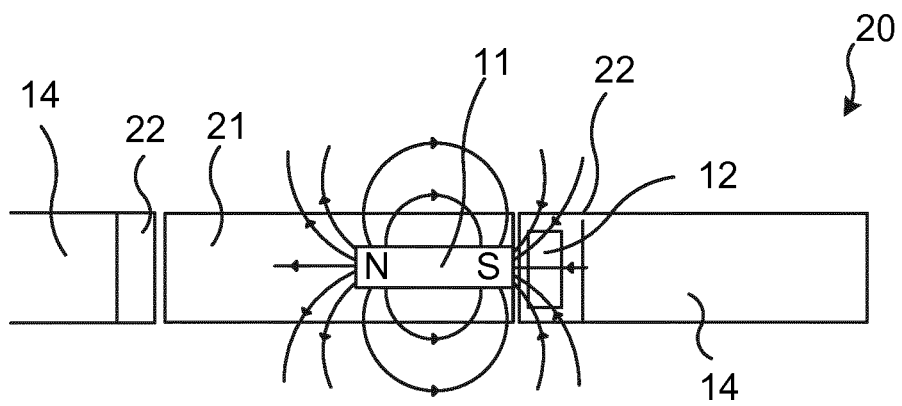
FIGS. 1A-C are schematic diagrams illustrating an embodiment of a barrier assembly at different extents of its openable barrier being open.
Figure 1B:
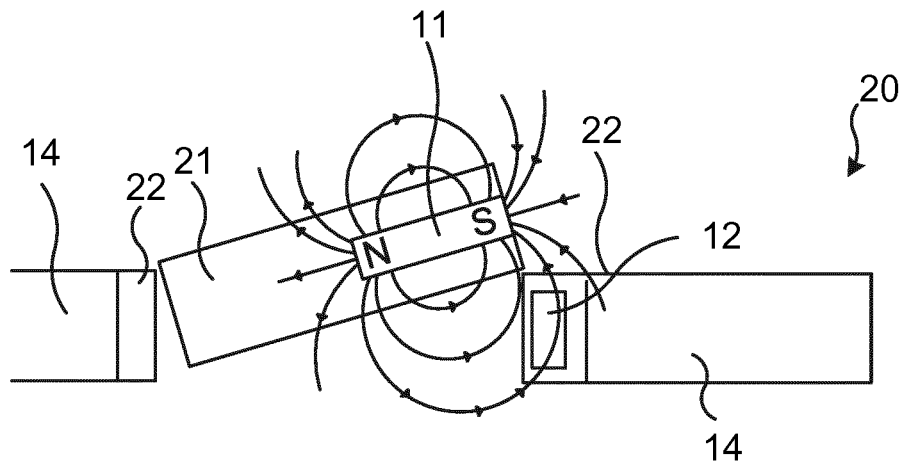
Figure 1C:
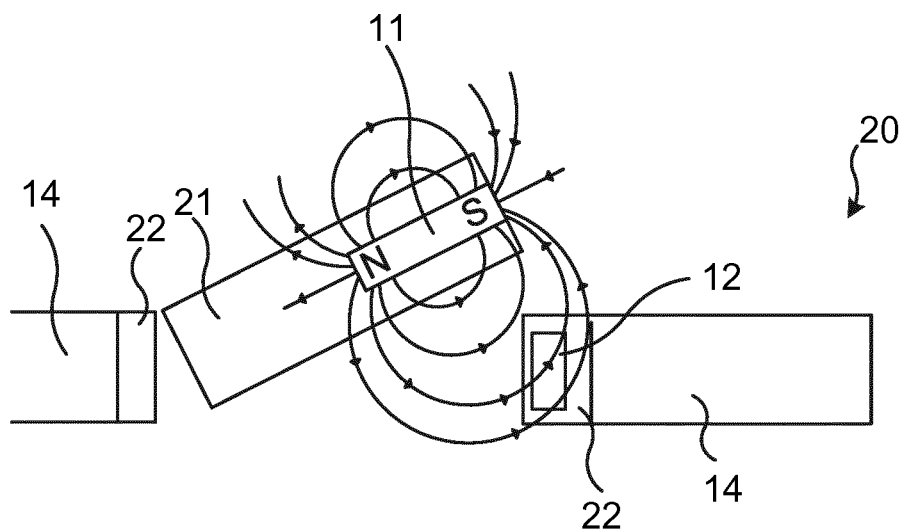

FIGS. 1A-C are schematic diagrams illustrating an embodiment of a barrier assembly 20 at different extents of its openable barrier 21 being open. The view in FIGS. 1A-C are all in the form of a top view. The openable barrier 21 can be a window, door, gate, hatch, drawer, garage door, loading dock door, etc. Optionally, the openable barrier 21 is lockable. The openable barrier 21 can be in an closed state as shown in FIG. 1A, in a slightly open state as shown in FIG. 1B or in a more open state as shown in FIG. 1C. The openable barrier 21 can also be in a fully open state (not shown).

There is a barrier frame 22 around the openable barrier 21. The barrier frame 22 is mounted in a surrounding structure 14. The surrounding structure 14 can e.g. be a wall, fence, ceiling, floor, etc. The opening and closing of the openable barrier 21 can be implemented using a side hinge such as shown here. However, any other way of implementing a mechanism for opening the barrier can be used, e.g. a top (or bottom) hinge for tilt opening, a jalousie, rolling door (e.g. for garage), sliding mechanism, sash mechanism (e.g. sash window), etc.

The openable barrier 21 can be open to varying degrees, which is determined using a magnet 11 and a magnetic sensor 12. The magnet 11 is a permanent magnet, i.e. a magnet that does not need an electric power supply to emit a magnetic field. The magnetic sensor 12 is able to detect a magnetic field and also the direction of a magnetic field. The magnetic sensor 12 can be in a device also containing other sensors and/or other functionality, including processing capability and wireless communication capability. The magnetic sensor 12 may contain its own power supply, e.g. in the form of a battery.

The barrier position here defines an extent of opening of the barrier 21. For instance, the barrier position and the extent of opening can indicate closed, fully open, open 90 degrees, open 21 degrees, etc. Alternatively, the extent of openness of the openable barrier 21 can be expressed as a percentage of fully open, so that closed results in 0, fully open results in 100 and other degrees of openness result in a number between 0 and 100. Other scales can equally well be used as long as the extent of opening is not a simple state indicator reflecting only open, closed and/or in between open and closed. Hence, values representing extent of opening comprise respective representations of completely open, completely closed and a plurality of different extents of opening between completely open and completely closed.

In the embodiment of FIGS. 1A-C, the magnet 11 is provided in the openable barrier 21. The magnetic sensor 12 is provided in the barrier frame 22. The magnet 11 provides a constant magnetic field, flowing out from the north pole of the magnet 11, around the magnet 11 (as shown in FIGS. 1A-C) and to the south pole of the magnet 11. In FIG. 1A, the average direction of the magnetic field through the magnetic sensor 12 is essentially from right to left. In FIG. 1B, the average direction of the magnetic field through the magnetic sensor 12 is essentially from the bottom to the top. In FIG. 1C, the average direction of the magnetic field through the magnetic sensor 12 is from left and a little upwards. Consequently, the average direction of magnetic field detected by the magnetic sensor 12 can be used to determine the extent of opening of the openable barrier 21. The mapping from average direction of the magnetic field through the magnetic sensor 12 and extent of opening can be based on a lookup table or a function.

Using the magnetic field to determine position/extent of opening of the openable barrier 21 does not require physical contact between the magnet 11 and magnetic sensor 12. Moreover, this type of determination works well regardless of weather or climate conditions.

Figure 2:
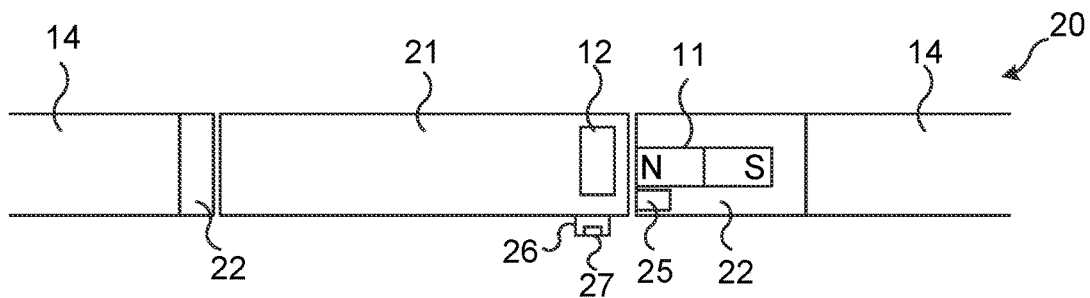
FIG. 2 is a schematic diagram illustrating an embodiment of a barrier assembly where the magnetic sensor is provided in the openable barrier.

FIG. 2 is a schematic diagram illustrating an embodiment of a barrier assembly 20 where the magnetic sensor 12 is provided in the openable barrier 21. The same principles as shown in FIGS. 1A-C and explained above are also applicable for this embodiment.

Optionally, the barrier assembly 20 comprises a lock state sensor 25 being configured to detect when the openable barrier 21 is in a locked state. The lock state sensor can e.g. detect when an espagnolette is in a state where its espagnolette rod has engaged with the barrier frame 22. Alternatively, the lock state sensor 25 can be a sensor (proximity or inductive) configured to detect when a locking bolt is extended in a striking plate of the barrier frame 22.

The combination of the magnetic sensor 12 and the lock state sensor 25 allows a detection of when the barrier is closed and locked, when the barrier is in a ventilation state (and optionally secured in that state), or open and not secured (neither in closed state nor in ventilation state).

Optionally, another sensor is used to wake-up the magnetic sensor 12. For instance, the magnetic sensor 12 can be activated when the lock is secure and optionally also when a sensor 27 on a handle 26 detects that the handle 26 is being operated (e.g. using a touch sensor or an accelerometer detecting movement of the handle 26).

Figure 3A:
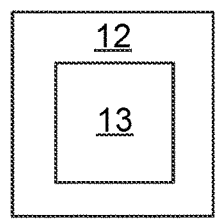
FIG. 3A-B are schematic diagrams illustrating embodiments of where a status monitoring device can be implemented.
Figure 3B:
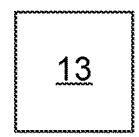

FIGS. 3A-B are schematic diagrams illustrating embodiments of where a status monitoring device 13 can be implemented. The status monitoring device 13 is the device that performs the determination of extent of opening (position) of the openable barrier based on the direction of the magnetic field detected by the magnetic sensor.

In FIG. 3A, the status monitoring device 13 is shown in an embodiment where the status monitoring device forms part of the magnetic sensor 12. The magnetic sensor 12 is thus the host device for the status monitoring device 13 in this embodiment.

In FIG. 3B, the status monitoring device 13 is shown in an embodiment where the status monitoring device is implemented as a stand-alone device. The status monitoring device 13 thus does not have a host device in this embodiment. In this embodiment, the status monitoring device 13 receives a signal containing the direction of the magnetic field from the magnetic sensor 12.

Figure 4:
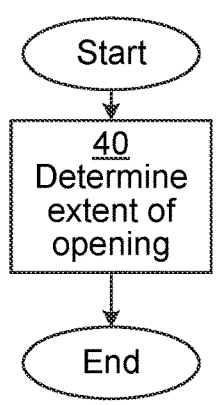
FIG. 4 is a flow chart illustrating a method for determining an extent of opening of an openable barrier of a barrier assembly according to the embodiments shown in FIGS. 1A-C and FIG. 2.

FIG. 4 is a flow chart illustrating a method for determining an extent of opening of an openable barrier of a barrier assembly according to the embodiments shown in FIGS. 1A-C and FIG. 2. The method is performed in the status monitor device.

In a determine extent of opening step 40, the status monitor device determines an extent of opening of the openable barrier based on a direction of a magnetic field detected by a magnetic sensor. As explained above, one of a magnet and the magnetic sensor is provided in the barrier and the other of the magnet and the magnetic sensor is provided in the barrier frame. In other words, either the magnet is provided in the openable barrier and the magnetic sensor is provided in the barrier frame, or the magnet is provided in the barrier frame and the magnetic sensor is provided in the openable barrier.

The extent of opening of the barrier can be determined by comparing a direction of a magnetic field determined by the magnetic sensor, with a known orientation of the magnet. For instance, it can be known that the magnet is mounted in the openable barrier with its north pole facing the barrier frame. The comparing of direction of magnetic field with the known orientation of the magnet can then result in one of a plurality values defining an extent of opening of the openable barrier. The plurality of values comprises respective representations of completely open, completely closed and a plurality of different extents of opening between completely open and completely closed.

Once the extent of opening of the barrier has been determined, an action can be performed based on the determined extent of opening of the barrier. For instance, the status monitor device can inform other systems (e.g. alarm system, HVAC (Heating Cooling Air Conditioning) system, etc.) of the status of the barriers based on the provided extent of opening of the barrier. For instance, the alarm system or the HVAC system can be informed of any open doors or windows to adjust ventilation and/or heating/cooling. The data relating to the extent of opening of the barrier can be used for energy efficiency purposes, informing when the door/window is open and/or using this information to calculate energy efficiency.

Optionally, the status monitoring device can detect when a tamper attempt is performed and a magnet is placed close to the magnetic sensor, but the field from the magnet is inconsistent with previously measured magnetic fields.

Figure 5:
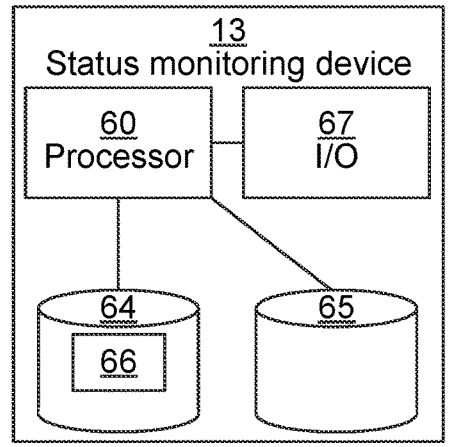
FIG. 5 is a schematic diagram showing some components of the status monitoring device of FIGS. 3A-B.

FIG. 5 is a schematic diagram showing some components of the status monitoring device 13 of FIGS. 3A-B. It is to be noted that one or more of these components can optionally be shared with the host device, such as the magnetic sensor 12 in FIG. 3A and described above. A processor 60 is provided using any combination of one or more of a suitable central processing unit (CPU), multiprocessor, microcontroller, digital signal processor (DSP), application specific integrated circuit etc., capable of executing software instructions 66 stored in a memory 64, which can thus be a computer program product. The processor 60 can be configured to execute the method described with reference to FIG. 4 above.

The memory 64 can be any combination of read and write memory (RAM) and read only memory (ROM). The memory 64 also comprises persistent storage, which, for example, can be any single one or combination of magnetic memory, optical memory, solid state memory or even remotely mounted memory.

A data memory 65 is also provided for reading and/or storing data during execution of software instructions in the processor 60. The data memory 65 can be any combination of read and write memory (RAM) and read only memory (ROM).

The status monitoring device 13 further comprises an I/O interface 67 for communicating with other external entities, such as other external systems e.g. an alarm system and/or an HVAC system. Optionally, the I/O interface 67 also includes a user interface.

Other components of the status monitoring device 13 are omitted in order not to obscure the concepts presented herein.

Figure 6:
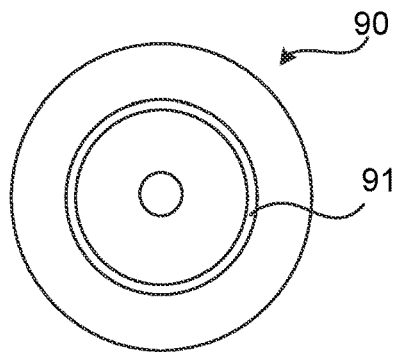
FIG. 6 shows one example of a computer program product comprising computer readable means.

FIG. 6 shows one example of a computer program product comprising computer readable means. On this computer readable means a computer program 91 can be stored, which computer program can cause a processor to execute a method according to embodiments described herein. In this example, the computer program product is an optical disc, such as a CD (compact disc) or a DVD (digital versatile disc) or a Blu-Ray disc. As explained above, the computer program product could also be embodied in a memory of a device, such as the computer program product 64 of FIG. 5. While the computer program 91 is here schematically shown as a track on the depicted optical disk 90, the computer program can be stored in any way which is suitable for the computer program product, such as a removable solid state memory, e.g. a Universal Serial Bus (USB) drive.

Here now follows a list of embodiments from another perspective, enumerated with roman numerals.

i. A barrier assembly for determining a position of an openable barrier, the barrier assembly comprising the openable barrier and barrier frame around the openable barrier; a magnet, a magnetic sensor and a status monitoring device;

wherein one of the magnet and the magnetic sensor is provided in the barrier and the other of the magnet and the magnetic sensor is provided in the barrier frame; and the status monitoring device is configured to determine a position of the openable barrier based on a direction of a magnetic field detected by the magnetic sensor.

ii. The barrier assembly according to embodiment i, wherein the barrier position is determined by comparing a direction of a magnetic field determined by the magnetic sensor, with a known orientation of the magnet.

iii. The barrier assembly according to embodiment i or ii, wherein the status monitoring device forms part of the magnetic sensor.

iv. The barrier assembly according to any one of the preceding embodiments, wherein the barrier assembly is a window assembly.

v. The barrier assembly according to any one of embodiments i to iii, wherein the barrier assembly is a door assembly.

vi. The barrier assembly according to any one of the preceding embodiments, further comprising a lock state sensor being configured to detect when the openable barrier is in a locked state.

vii. A method for determining a position of an openable barrier of a barrier assembly comprising the openable barrier and a barrier frame, the method being performed in a status monitor device and comprising the step of:

determining a position of the openable barrier based on a direction of a magnetic field determined by a magnetic sensor, wherein one of a magnet and the magnetic sensor is provided in the barrier and the other of the magnet and the magnetic sensor is provided in the barrier frame.

viii. The method according to embodiment vii, wherein the barrier position is determined by comparing a direction of a magnetic field, detected by the magnetic sensor, with a known orientation of the magnet.

ix. A computer program for determining a position of an openable barrier of a barrier assembly comprising the openable barrier and a barrier frame, the computer program comprising computer program code which, when run on a status monitor device causes the status monitor device to:

determine a position of the openable barrier using a magnetic sensor, wherein one of a magnet and the magnetic sensor is provided in the barrier and the other of the magnet and the magnetic sensor is provided in the barrier frame.

x. A computer program product comprising a computer program according to embodiment ix and a computer readable means on which the computer program is stored.

The invention has mainly been described above with reference to a few embodiments. However, as is readily appreciated by a person skilled in the art, other embodiments than the ones disclosed above are equally possible within the scope of the invention, as defined by the appended patent claims.

What is claimed is:

1. A barrier assembly for determining an extent of opening of an openable barrier, the barrier assembly comprising the openable barrier and barrier frame around the openable barrier; a magnet, a magnetic sensor, a status monitoring device and a lock state sensor being configured to detect when the openable barrier is in a locked state;
   wherein the barrier assembly is configured to activate the magnetic sensor when the lock sensor detects that the openable barrier is in a locked state and when a sensor on a handle detects that the handle is being operated;
   wherein one of the magnet and the magnetic sensor is provided in the barrier and the other of the magnet and the magnetic sensor is provided in the barrier frame; and
   the status monitoring device is configured to determine an extent of opening of the openable barrier based on a direction of a magnetic field detected by the magnetic sensor.

2. The barrier assembly according to claim 1, wherein the extent of opening of the barrier is determined by comparing a direction of a magnetic field determined by the magnetic sensor, with a known orientation of the magnet.

3. The barrier assembly according to claim 2, wherein the comparing of direction of magnetic field with the known orientation of the magnet results in one of a plurality values defining an extent of opening of the openable barrier, wherein the plurality of values comprises respective representations of completely open, completely closed and a plurality of different extents of opening between completely open and completely closed.

4. The barrier assembly according to claim 1, wherein the status monitoring device forms part of the magnetic sensor.

5. The barrier assembly according to claim 1, wherein the barrier assembly is a window assembly.

6. The barrier assembly according to claim 1, wherein the barrier assembly is a door assembly.

7. A method for determining an extent of opening of an openable barrier of a barrier assembly comprising the openable barrier and a barrier frame, the method being performed in a status monitor device and comprising:
   activating the magnetic sensor when a lock sensor of the barrier assembly detects that the openable barrier is in a locked state and when a sensor on a handle detects that the handle is being operated;
   determining an extent of opening of the openable barrier based on a direction of a magnetic field determined by a magnetic sensor, wherein one of a magnet and the magnetic sensor is provided in the barrier and the other of the magnet and the magnetic sensor is provided in the barrier frame.

8. The method according to claim 7, wherein the extent of opening of the barrier is determined by comparing a direction of a magnetic field, detected by the magnetic sensor, with a known orientation of the magnet.

9. The method according to claim 8, wherein the comparing of direction of magnetic field with the known orientation of the magnet results in one of a plurality values defining an extent of opening of the openable barrier, wherein the plurality of values comprises respective representations of completely open, completely closed and a plurality of different extents of opening between completely open and completely closed.

10. A computer program stored in a non-transitory computer readable medium for determining an extent of opening of an openable barrier of a barrier assembly comprising the openable barrier and a barrier frame, the computer program comprising computer program code which, when run on a status monitor device causes the status monitor device to:
   activate the magnetic sensor when a lock sensor of the barrier assembly detects that the openable barrier is in a locked state and when a sensor on a handle detects that the handle is being operated;
   determine an extent of opening of the openable barrier using a magnetic sensor, wherein one of a magnet and the magnetic sensor is provided in the barrier and the other of the magnet and the magnetic sensor is provided in the barrier frame.

* * * * *